(12) United States Patent
Chen

(10) Patent No.: US 7,030,790 B1
(45) Date of Patent: Apr. 18, 2006

(54) SYSTEMS AND METHODS FOR AUTO GAIN CONTROL IN BI-CMOS DIGITAL TO ANALOG CONVERTERS

(75) Inventor: Chun-Ying Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/025,963

(22) Filed: Jan. 3, 2005

Related U.S. Application Data

(60) Provisional application No. 60/620,971, filed on Oct. 22, 2004.

(51) Int. Cl.
*H03M 1/10* (2006.01)

(52) U.S. Cl. ......................... 341/118; 341/127

(58) Field of Classification Search ................ 341/118, 341/120, 135, 136, 144, 153, 127
See application file for complete search history.

(56) References Cited

U.S. PATENT DOCUMENTS

| | | | |
|---|---|---|---|
| 4,701,694 A * | 10/1987 | Penney et al. .............. 323/317 |
| 4,774,497 A * | 9/1988 | Taylor ......................... 341/118 |
| 4,888,589 A * | 12/1989 | Bowers ....................... 341/153 |
| 5,729,231 A * | 3/1998 | Kikuchi ...................... 341/144 |
| 6,222,473 B1 * | 4/2001 | Castaneda et al. .......... 341/154 |
| 6,492,924 B1 * | 12/2002 | Copley et al. .............. 341/139 |
| 6,859,157 B1 * | 2/2005 | Gunther ...................... 341/144 |
| 2002/0063646 A1 * | 5/2002 | Copley et al. .............. 341/144 |

OTHER PUBLICATIONS 10-bit, 1000 Msps Digital-to-Analog Converter (DAC), Philips Semiconductors Product Specification No. TDA8776A, Jun. 4, 1996, pp 1-19.

* cited by examiner

*Primary Examiner*—Rexford Barnie
*Assistant Examiner*—Linh Nguyen
(74) *Attorney, Agent, or Firm*—Sterne, Kessler, Goldstein & Fox, P.L.L.C.

(57) ABSTRACT

The accuracy of output power in a digital-to-analog converter (DAC) is critical in certain applications. When bi-CMOS technology is used to implement a DAC, a number of factors affect the gain accuracy of the DAC. The present invention provides a circuit architecture to reduce the variation in these factors to ensure the accuracy of the output power of a DAC. The architecture comprises a bandgap portion, replica circuit and a DAC. The bandgap portion of the architecture provides a constant voltage, while the replica circuit provide a correct current to drive the DAC.

11 Claims, 5 Drawing Sheets

SYSTEMS AND METHODS FOR AUTO GAIN CONTROL IN BI-CMOS DIGITAL TO ANALOG CONVERTERS

CROSS REFERENCE TO RELATED APPLICATIONS

This application claims the benefit of priority to U.S. Provisional Patent Application No. 60/620,971, filed Oct. 22, 2004, which is incorporated herein by reference in its entirety.

BACKGROUND OF THE INVENTION

1. Field of the Invention

The invention relates to digital-to-analog converters (DAC), and more particularly to automatic gain control in DACs.

2. Background Art

A digital-to-analog converter (DAC) is an electronic circuit that receives an n-bit digital word from an interface circuit and generates an analog output that is proportional to the received digital word. Digital codes are typically converted to analog voltages by assigning a voltage weight to each bit in the digital code and then summing the voltage weights of the entire code.

DACs can be designed for a wide range of applications, including general data acquisition applications and special applications, such as, but not limited to, video or graphic outputs, high definition video displays, ultra high-speed signal processing, and digital video recording.

The major factors that determine the performance quality of a DAC are resolution, speed, and linearity. Resolution refers to the smallest change in the output analog signal that is supported. The resolution determines the total number of digital codes, or quantization levels, that will be recognized by a converter. The speed of a DAC is determined by the time it takes to perform the conversion process. Measurement accuracy is specified by a DAC's linearity. Integral linearity, which is also referred to as relative accuracy, is a measure of the linearity over the entire conversion range. It is often defined as the deviation from a straight line drawn between the endpoints and through zero (or offset value) of the conversion range. Differential linearity is the linearity between code transition.

The accuracy of a DAC is critical in certain applications. When a DAC has a high degree of accuracy, the control range of a subsequent gain control loop and complexity of circuit stages that may follow a DAC can be reduced. As a result, system cost and power requirements can be minimized.

When Bi-CMOS technology is used to implement a DAC, at least three factors impact the accuracy of the DAC. First, resistive loads of resistors used in a DAC can vary depending on temperature and fabrication process. Second, the current through differential pairs of transistors within a DAC can vary based on fabrication process, temperature and supply voltage. Third, when bipolar devices are used there is some current flow into the base of the devices due to finite beta ($\beta$) values.

What are needed are systems and methods to reduce the impact of the above variations to improve DAC accuracy.

BRIEF SUMMARY OF THE INVENTION

The accuracy of output power in a digital-to-analog converter (DAC) is critical in certain applications. When bi-CMOS technology is used to implement a DAC, a number of factors affect the gain accuracy of the DAC. The present invention provides a digital-to-analog auto gain control system to reduce the variation in these factors to ensure the accuracy of the output power of a DAC. The architecture comprises a bandgap portion, replica circuit and a DAC. The bandgap portion of the architecture provides a constant voltage, while the replica circuit provides an appropriate current to drive the DAC.

Further embodiments, features, and advantages of the invention, as well as the structure and operation of the various embodiments of the invention are described in detail below with reference to accompanying drawings.

BRIEF DESCRIPTION OF THE FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
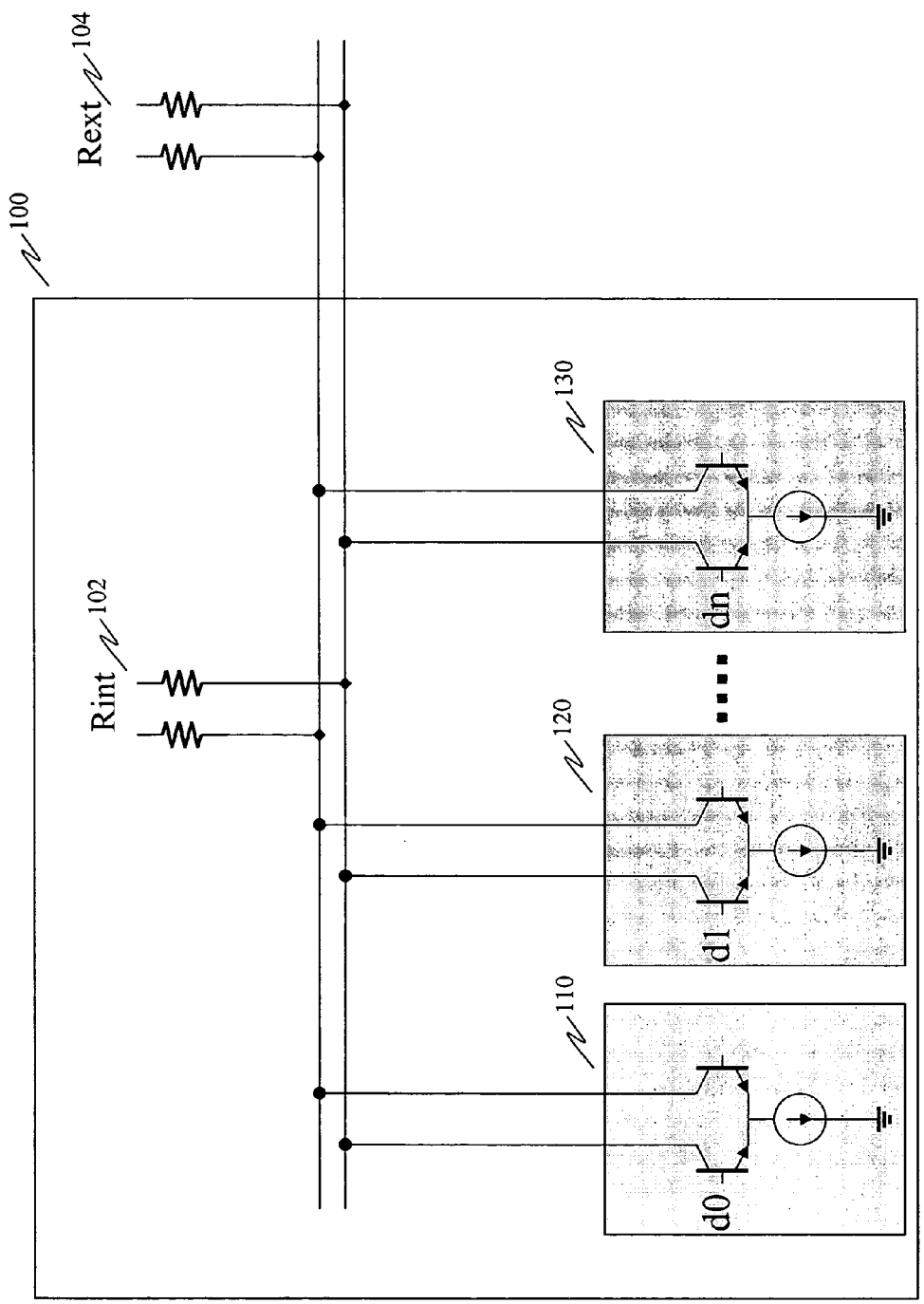
FIG. 1 is a diagram of DAC.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of utility.

FIG. 1 provides a diagram of DAC 100. DAC 100 has resistor loads 102 and 104 sourcing or sinking current out from several differential pairs, as illustrated by differential pairs 110, 120, and 130 with constant current source. Thus, the voltage drop across the resistor load is proportional to the digital codes, and output voltage swing is proportional to the product of the effective output resistance and the biasing current in the differential pair. The design and operation of DACs will be known by individuals skilled in the relevant arts.

As discussed above, when Bi-CMOS technology is used to implement a DAC, such as DAC 100, at least three factors impact the accuracy of the DAC. First, performance of resistors used in a DAC can vary depending on temperature and fabrication process. Second, the current through differential pairs within a DAC can vary based on fabrication process, temperature and supply voltage. Third, when bipolar devices are used to implement the differential pairs there is some current flow into the base due to finite β values. β values refer to the ratio of the collector current versus base current. The sum of a collector current and base current must equal the emitter current, which is the biasing current in a differential pair.

Figure 2:
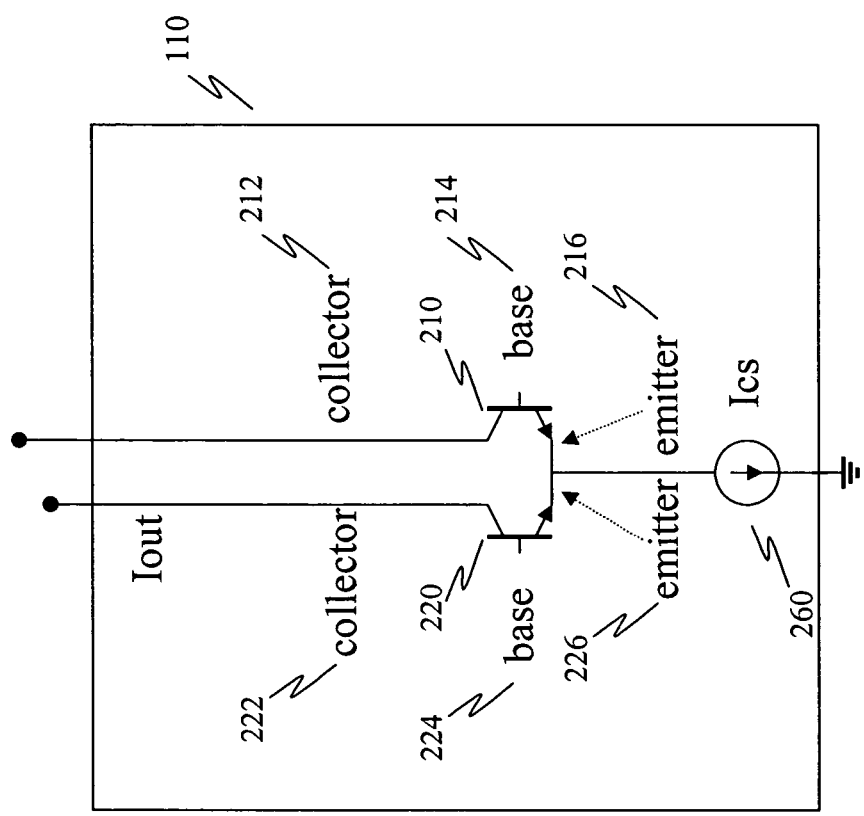
FIG. 2 is a diagram illustrating the relationship between base, collector and emitter currents.

FIG. 2 provides a diagram illustrating the relationship between base, collector and emitter currents to demonstrate the impact of beta variations on performance. FIG. 2 shows differential pair 110. Differential pair 110 includes transistor 210, transistor 220, and current source 260. Transistor 210 includes collector 212, base 214, an emitter 216. Similarly, transistor 220 includes collector 222, base 224 and emitter 226. Emitters 216 and 226 are coupled together and are coupled to current source 260. Bipolar devices, such as transistors 210 and 220, will have some current flow into their bases due to finite β values. The β value is the ratio of the collector current versus the base current. Thus, referring to transistor 220, the beta value is the ratio of the current flowing through collector 222 versus the current flowing through base 224. Furthermore, as illustrated by FIG. 2, the sum of the collector current and the base current must equal the emitter current, which is equal to the biasing current generated by current source 260 in the differential pair of transistors 210 and 220. The collector current can also be referred to as $I_{out}$, and the emitter current can be referred to as $I_{cs}$, which is also the biasing current being generated by current source 260. The relationship between $I_{out}$ and $I_{cs}$ is given as:

$$I_{out}=I_{cs}*\beta/(\beta+1) \qquad (1)$$

Thus, $I_{out}$, which is the current flowing through collector 222, will be smaller when β is smaller. Because the current flowing through collector 222 is the current going to a resistor load, the output power of a DAC, such as DAC 100, will be less. The operational challenge arises in that β is temperature and process dependent.

For example, typically a β value is around 100. But at a high temperature and a worst-case process corner, the β value could drop to 30. If β=30, the output current is about 97% of the current of the current source designed in a differential pair. This means that the output voltage will be 3% lower than what would be expected, and that the output power will by 9% lower that expected.

Figure 3:
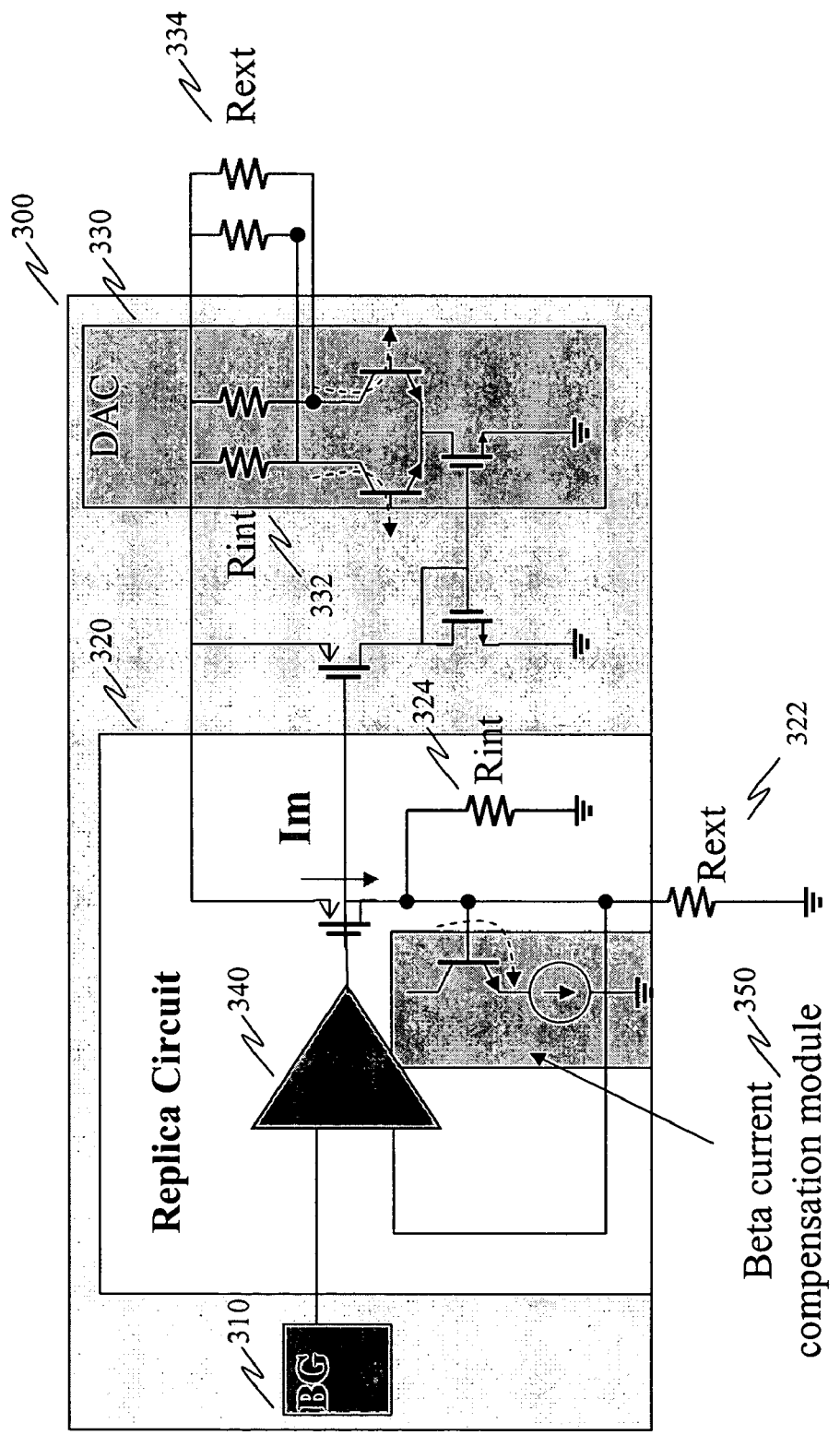
FIG. 3 is a diagram of a DAC auto gain control system, according to an embodiment of the invention.

FIG. 3 is a diagram of DAC auto gain control system 300, according to an embodiment of the invention. DAC auto gain control system 300 includes bandgap portion 310, replica circuit 320 and DAC 330.

DAC auto gain control system 300 provides superior DAC accuracy performance by compensating for resistor, current source, and bipolar accuracy impacts due to the process, temperature and supply voltage variations discussed above. Bandgap portion 210 provides a constant voltage, which is about 1.25 V when silicon technology is used. The invention is not, however, limited to silicon technology. Furthermore, an external voltage reference can be used to provide a constant voltage. Replica circuit 320 provides a correct current to drive DAC 330. Replica circuit 320 provides a current such that the voltage drop across resistors 322 and 324 track with the bandgap voltage. This is achieved by using an operational amplifier, such as operational amplifier 340, to force a current equal to the bandgap voltage divided by resistors, which have the same type of external resistors 334 and 322 and internal resistor 332 and 324 loads of DAC 330. The same amount of current is mirrored to DAC 330. Thus, the output voltage swing of DAC 330 tracks with the bandgap voltage generated by bandgap portion 310

Furthermore, to compensate for beta current loss in DAC 330, replica circuit 320 also has a current bleeding path through the same type of bipolar devices as are used in DAC 330, which is shown as beta current compensation module 350. The differential pair within DAC 330 may have some cascaded bipolar devices at its output or in a current source. Similar bipolar devices can be inserted in the replica circuit to compensate the corresponding base current. The voltages across the bipolar devices in replica circuit 320 are biased so that they are matched to the ones in DAC 330.

Figure 4:
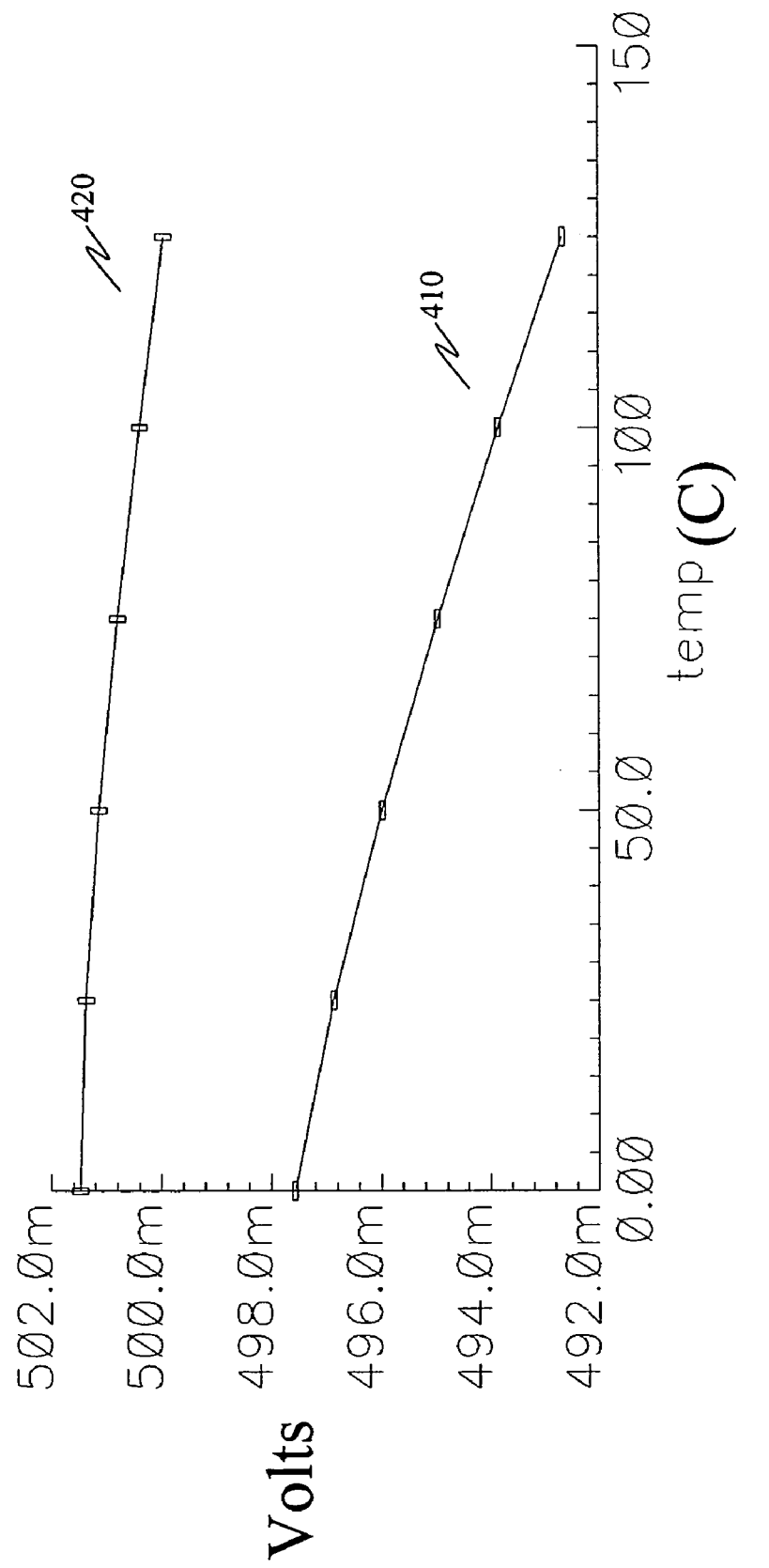
FIG. 4 is a chart showing DAC simulation results with and without beta current compensation, according to an embodiment of the invention.

FIG. 4 provides chart 400 showing simulation results with and without beta current compensation. Curve 410 of FIG. 4 shows that without beta current compensation, DAC 330 output voltage has a variation of 6 mV when temperature changes from 0 to 125° C. When a beta compensation circuit is used, the output voltage only has a 1 mV change when temperature changes from 0 to 125° C.

Figure 5:
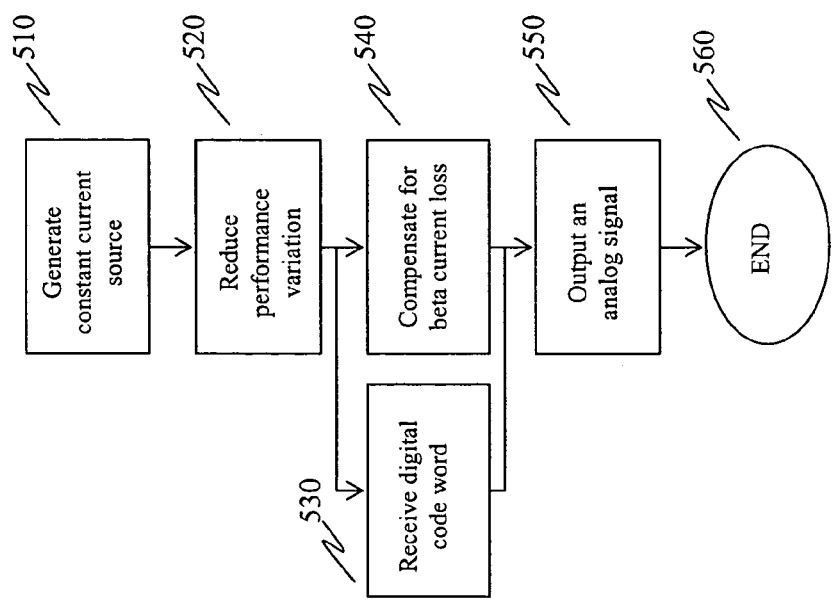
FIG. 5 provides a method for auto gain control in a digital-to-analog converter, according to an embodiment of the invention.

FIG. 5 provides a method 500 for auto gain control in a digital-to-analog converter, according to an embodiment of the invention. In step 510, a constant current source is generated and provided to a digital-to-analog converter. For example, replica circuit 320 can provide a constant current source to DAC 330. In step 520, performance variations within DAC 330 are reduced.

These performance variations can be attributable to process variations in the manufacturing of components used within DAC 330. Additionally, they can be the result of temperature changes, supply voltage changes or other real time variations. In an example, these variations are compensated for by forcing a correct current into DAC 330 from replica circuit 320. In step 520, for example, on-chip resistor variation and off-chip resister variation can be compensated for.

In step 530, a digital code word is received. For example, DAC 330 can receive a digital code word. In one embodiment as depicted in FIG. 5, step 530 can occur in parallel with step 540. In other embodiments, step 530 can occur at other times prior to the outputting of an analog signal.

In step 540 beta current loss in differential pairs within a digital-to-analog converter are compensated for. For example, beta current compensation module 350 can be used to compensate for beta current loss in differential pairs in DAC 330. In other embodiments, beta current loss may not be compensated for.

In step 550 an analog signal is output from the digital-to-analog converter. The analog signal is based on the received digital code word. For example, DAC 330 can output an analog signal. In step 560, method 500 ends.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A digital to analog auto gain control system, comprising:

a constant voltage source;

a replica circuit coupled to said constant voltage source, wherein said replica circuit includes resistors and a beta compensation module having bipolar devices;

a digital-to-analog converter having bipolar devices coupled to said replica circuit, wherein said replica circuit provides a current to said digital-to-analog converter such that a voltage drop across said resistors tracks with a voltage of said constant voltage, wherein said beta compensation module compensates for a beta current loss in said digital-to-analog converter, wherein said beta compensation module bipolar devices mimic said digital-to-analog bipolar devices.

2. The digital-to-analog auto gain control system of claim 1, wherein said replica circuit further comprises an operational amplifier that forces said current to said digital-to-analog converter such that a voltage drop across said resistors track with a voltage of said constant voltage.

3. The digital-to-analog auto gain control system of claim 1, wherein said constant voltage source is provided by an external voltage reference.

4. The digital-to-analog auto gain control system of claim 1, wherein said beta current compensation module comprises a transistor and current source.

5. The digital-to-analog auto gain control system of claim 1, wherein said digital-to-analog auto gain control system compensates for potential performance degradation of said digital-to-analog converter attributable to manufacturing process variation of components of said digital-to-analog converter.

6. The digital-to-analog auto gain control system of claim 1, wherein said digital-to-analog auto gain control system compensates for potential performance degradation of said digital-to-analog converter attributable to operating temperature variation.

7. A method for auto gain control in a digital-to-analog converter system having a digital-to-analog converter that includes bipolar devices and a beta compensation module that includes bipolar devices, comprising:

(a) receiving a digital code word;

(b) generating a constant current source based on a constant voltage source;

(c) reducing performance variations attributable to process variations, temperature changes and/or supply voltage variations;

(d) mimicking bipolar device operation within the digital to-analog converter with bipolar devices in the beta compensation module to compensate for beta current loss in the digital-to-analog converter; and (e) outputting a converted analog signal based on the received digital code word.

8. The method of claim 7, wherein said digital-to-analog converter is located on a chip with on-chip and off-chip resistors, wherein said reducing performance variations includes compensating for on-chip resistor variations and off-chip resistor variations.

9. The method of claim 8, wherein the circuit layout of a differential pair includes more than one differential pair and multiple bipolar devices.

10. The method of claim 7, wherein reducing performance variations includes supplying a constant voltage source.

11. The method of claim 7, wherein reducing performance variations includes forcing a constant current source into the digital-to-analog converter.

* * * * *